United States Patent

[11] 3,614,559

[72] Inventor Max Guntersdorfer
Munich, Germany

[21] Appl. No. 828,199
[22] Filed May 27, 1969
[45] Patented Oct. 19, 1971
[73] Assignee Siemens Aktiengesellschaft
Berlin and Munich, Germany
[32] Priority May 27, 1968
[33] Germany
[31] P 17 64 373.1

[54] BARRIER-FREE SEMICONDUCTOR SWITCHING DEVICE
7 Claims, 5 Drawing Figs.

[52] U.S. Cl. .......... 317/238, 317/234
[51] Int. Cl. .......... H01l 9/00
[50] Field of Search .......... 252/517; 317/238

[56] References Cited
UNITED STATES PATENTS

| | | | |
|---|---|---|---|
| 2,720,573 | 10/1955 | Lundquist | 317/238 |
| 2,948,837 | 8/1960 | Postal | 317/238 |
| 3,271,591 | 9/1966 | Ovshinsky | 317/235 X |

*Primary Examiner*—James D. Kallam
*Attorneys*—Curt M. Avery, Arthur E. Wilfond, Herbert L. Lerner and Daniel J. Tick

ABSTRACT: Described is a barrier-free semiconductor component for switching, having at least two electrodes. The component is characterized by the fact that its semiconductor body is comprised of strontium vanadate with sporadic vanadium oxide inclusions.

BARRIER-FREE SEMICONDUCTOR SWITCHING DEVICE

Next to special transistors and diodes, comprised of monocrystalline semiconductor material, particularly PNPN switching diodes, increasing interest is found in polycrystalline or vitreous, amorphous semiconductor materials for semiconductor structural components used to produce switching processes. Thus, for example, a barrier-free, switchable semiconductor structural component, which is comprised of elemental boron, is known. Other possibilities are afforded by certain semiconducting glasses. An example is a glass that is comprised of silver oxide and boron oxide with an addition of $SiO_2$ which, when coated on a carrier in the form of a thin layer and equipped with electrodes, can be used as a switch. Finally, an electronic, bistable, barrier-free semiconductor component, comprised of antimony and an admixed material from Group IV of the Periodic System, particularly selenium or tellurium, is also known.

It is an object of the present invention to develop additional advantageous possibilities which are particularly characterized by a high switching amplitude.

The invention relates to a barrier-free semiconductor component for switching having at least two electrodes, which is so characterized that its semiconductor body is comprised of strontium vanadate with sporadic inclusions of vanadium oxide. These inclusions preferably consist of vanadium (IV) oxide and are needle shaped. For contacting purposes I seal in wires of noble metal, for example platinum.

When low voltages are applied, such component is insulating. When the applied voltage exceeds a certain characteristic value, the element becomes conductive. When a specific current value, the so called "holding current" is not reached during a reduction in the applied voltage; the element again returns to its insulating state. The structure is glassy and contains finely distributed $VO_2$.

Figures 1, 2, 3, 4, 5:
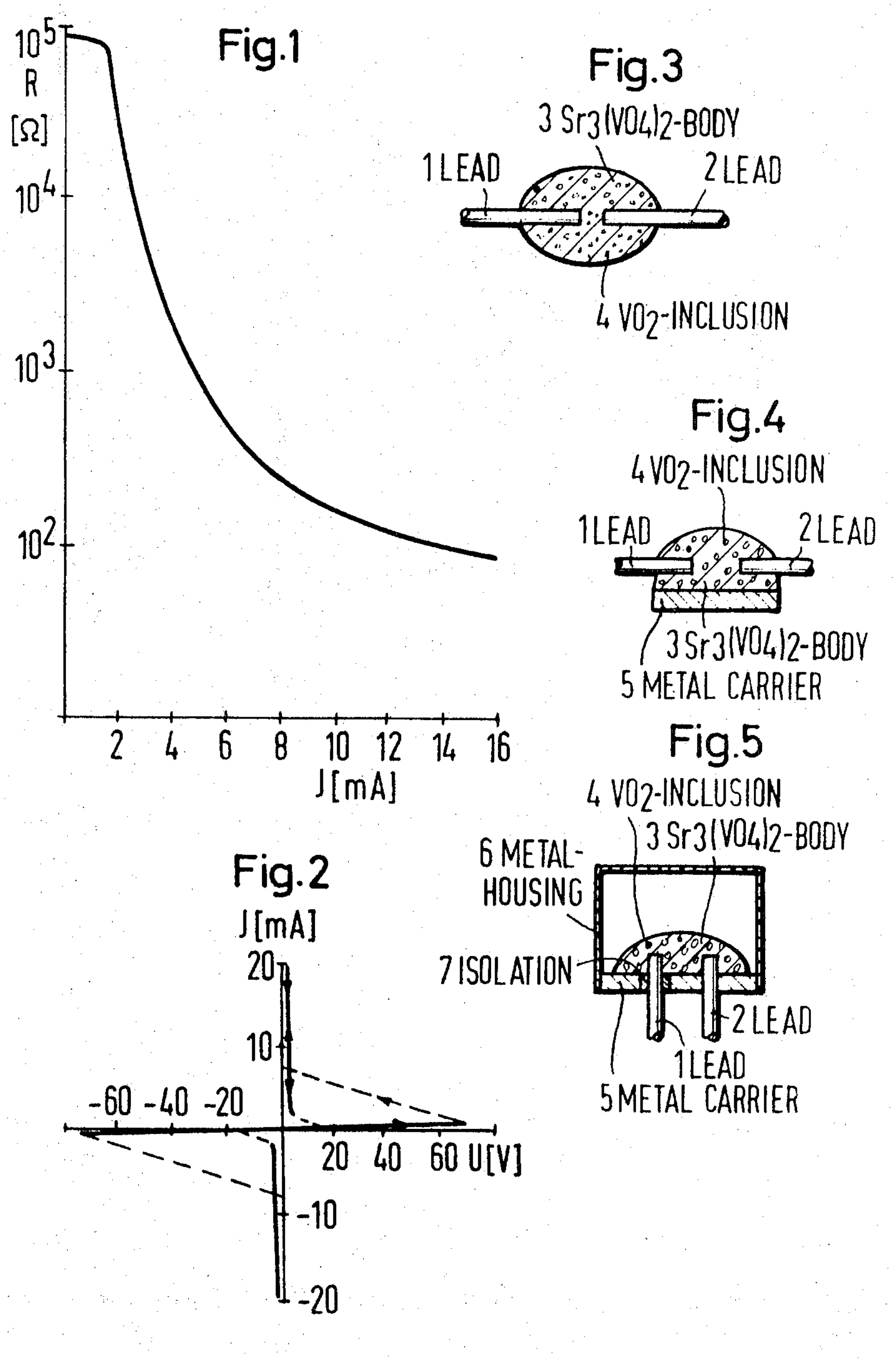
FIG. 1 shows the curve of the resistance as the ordinate to the current load as the abscissa.
FIG. 2 shows the current-voltage characteristic with the voltage as the abscissa.
FIG. 3 shows a component according to the invention.
FIG. 4 shows a component with metal carrier.
FIG. 5 shows a component with housing.

To produce a switching component according to the invention, it is preferred to mix vanadium pentoxide ($V_2O_5$) and strontium carbonate ($SrCO_3$) in a mole ratio V:Sr::75:25. Subsequently, the resulting powder is mixed into a paste with a little water and heated to approximately 90° C. A development of $CO_2$ indicates the formation of the resultant strontium vanadate. Now, a droplet of said mass is placed between two coaxial platinum wires, spaced at a slight distance from each other, then dried and melted in a slightly reduced hydrogen flame. The result is a shiny black pearl of high mechanical stability as seen in FIG. 3. In this figure, 1 and 2 are wire electrodes, e.g. of platinum, 3 is a strontium vanadate body with vanadium oxide inclusions 4.

The firing voltage of the component depends considerably on the diameter of the sealed-in platinum wires. At 20° C., when Pt-wires with a diameter of 0.1 mm. are used as electrodes, we have approximately 40 v.; for 0.5 mm. diameter approximately 140 v. The space between the wires diminishes only slightly. In a high-ohmic state, the resistance depends considerably on the degree of reduction. Resistances between 10 kilohm and 2 megohm can be easily obtained. The ratio between the resistances in high-ohmic and low-ohmic condition amount to $10^3$–$10^5$ and increases, the higher the resistance is in a high-ohmic state. It is recommended not to select the resistance ratio to be higher than about $3 \cdot 10^4$. The ratio between firing voltage and residual voltage is about 30 to 80. The switching periods are 150 nsec. or less.

It is recommended that the component be mounted in a metal housing in good heat-conducting relation, e.g. to be cemented-in or applied upon a metallic carrier. The switch can then be loaded at room temperature with currents up to 2 ma., without any notable heating.

During the production process, particular attention is to be paid to the reduction of the molten pearl. The following method is suggested: First, the dried droplet is molten in the oxidizing part of the hydrogen flame. Then, the molten pearl is held for a short time (at 1 mm. diameter about 5 sec.) in the reducing part of the flame. It is easy to recognize that reduction has set in by the fact that the surface of the pearl is not quite smooth following solidification. The resistance, particularly the high-ohmic resistivity, of said pearl can be changed by the degree of reduction. When the reduction is stronger, the resistance becomes smaller. When the pearl is allowed to cool without reduction, we obtain a completely smooth, glassy surface. The resistance of the component is then very high (more than 200 megohm) but no notable switching effect occurs.

A detailed testing of the switchable component according to the invention shows clearly the presence of vanadium oxide, particularly of $VO_2$ inclusions. The latter are predominantly needle shaped. It is recommended to continue the reduction process to such a degree, that points of contact will occur between said oxide inclusions. When $VO_2$ inclusions are used, the switching effect is eliminated at temperatures above 67° C. and upon cooling down, the switching effect reappears in full force.

FIG. 1 shows the curve of the resistance with respect to the applied current as the abscissa, while FIG. 2 shows the voltage-current characteristic with the voltage of the abscissa. Both these figures are self explanatory and are for the device described above. FIGS. 4 and 5, respectively, show the component on a metal carrier and on a metal carrier encased by a metal housing. These Figures are self-explanatory.

I claim:

1. A barrier-free semiconductor component for switching, having at least two electrodes embedded in a semiconductor body comprising strontium vanadate containing sporadic vanadium oxide inclusions.

2. The device of claim 1, wherein the inclusions at least partly consist of $VO_2$.

3. The device of claim 1, wherein the electrodes are noble metal.

4. The device of claim 3, wherein the electrodes are platinum wires.

5. The device of claim 3, wherein the semiconductor body is a layer upon a carrier with good heat-conducting properties.

6. The device of claim 5, wherein the device is located in a metallic housing.

7. The device of claim 6, wherein the oxide inclusions contact each other at some points.